(12) United States Patent
Akada et al.

(10) Patent No.: US 7,259,803 B2
(45) Date of Patent: Aug. 21, 2007

(54) RESIN SHEET, LIQUID CRYSTAL CELL SUBSTRATE COMPRISING THE SAME

(75) Inventors: Yuuzou Akada, Ibaraki (JP); Toshiyuki Umehara, Ibaraki (JP); Nobuyoshi Yagi, Ibaraki (JP); Tadaaki Harada, Ibaraki (JP); Yoshimasa Sakata, Ibaraki (JP); Hidetoshi Yoshitake, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 29 days.

(21) Appl. No.: 10/512,823

(22) PCT Filed: May 22, 2003

(86) PCT No.: PCT/JP03/06372

§ 371 (c)(1),
(2), (4) Date: Oct. 28, 2004

(87) PCT Pub. No.: WO03/099912

PCT Pub. Date: Dec. 4, 2003

(65) Prior Publication Data

US 2005/0129877 A1 Jun. 16, 2005

(30) Foreign Application Priority Data

May 27, 2002 (JP) .............................. 2002-151697

(51) Int. Cl.
*B32B 27/04* (2006.01)
*B32B 27/38* (2006.01)

(52) U.S. Cl. ..................... 349/1.53; 428/415; 349/117; 349/118; 349/122

(58) Field of Classification Search ................. 428/1.5, 428/1.53, 415; 349/117–118, 122, 150; 359/507; 361/762
See application file for complete search history.

(56) References Cited

U.S. PATENT DOCUMENTS 3,137,601 A * 6/1964 Menzer .................. 264/171.11
3,202,826 A * 8/1965 Greathouse .................. 356/341

(Continued)

FOREIGN PATENT DOCUMENTS

EP 769818 4/1997

(Continued)

OTHER PUBLICATIONS

Dow Chemical, Design Tools, Optical Properties, Haze, 2006. Retrieved from the internet [retrieved on Mar. 2, 2006] <URL: http://www.dow.com/sal/design/guide/optical.htm>.*

*Primary Examiner*—Rena Dye
*Assistant Examiner*—Sow-Fun Hon
(74) *Attorney, Agent, or Firm*—Westerman, Hattori, Daniels & Adrian, LLP.

(57) ABSTRACT

A resin sheet that is unlikely to be affected by heat and allows prevention of the occurrence of a crack is provided. A glass fiber cloth-like material is dipped into an epoxy resin solution and subjected to curing, thereby obtaining an epoxy resin-based sheet including the glass fiber cloth-like material. The resin sheet has a haze value of 10% or lower, and preferably, has a light transmittance of 88% or higher, an in-plane retardation of not more than 2 nm, a retardation in a thickness direction of 40 nm, and a surface roughness of not more than 2 μm.

18 Claims, 1 Drawing Sheet

U.S. PATENT DOCUMENTS

| | | | |
|---|---|---|---|
| 3,515,619 A * | 6/1970 | Barnette | 428/15 |
| 3,789,049 A * | 1/1974 | Nagasawa et al. | 523/213 |
| 4,116,207 A * | 9/1978 | Dominguez | 136/251 |
| 4,165,397 A * | 8/1979 | Ogden et al. | 427/140 |
| 5,478,682 A * | 12/1995 | Nishikawa et al. | 430/20 |
| 5,730,922 A * | 3/1998 | Babb et al. | 264/258 |
| 5,781,264 A * | 7/1998 | Noda et al. | 349/150 |
| 6,204,443 B1 | 3/2001 | Kiso et al. | 136/259 |
| 6,500,518 B2 * | 12/2002 | Sugawa et al. | 428/141 |
| 6,503,831 B2 * | 1/2003 | Speakman | 438/674 |
| 6,568,995 B1 * | 5/2003 | Mitani et al. | 451/36 |
| 6,818,263 B2 * | 11/2004 | Shimodaira et al. | 428/1.6 |
| 2002/0180711 A1 | 12/2002 | Umenmoto et al. | |
| 2002/0180910 A1 | 12/2002 | Umenmoto et al. | |

FOREIGN PATENT DOCUMENTS

| | | |
|---|---|---|
| EP | 1116987 | 7/2001 |
| JP | S54-078787 A | 6/1979 |
| JP | S60-001875 A | 1/1985 |
| JP | 6-238853 | 8/1994 |
| JP | 06-337408 | 12/1994 |
| JP | 7-199165 | 8/1995 |
| JP | 09-148606 | 6/1997 |
| JP | 11-218760 A | 8/1999 |
| JP | 2000-147429 A | 5/2000 |
| JP | 2000-147488 A | 5/2000 |
| JP | 2000-159908 | 6/2000 |
| JP | 2000-307137 | 11/2000 |
| JP | 2002-258256 | 9/2002 |
| JP | 2002-313121 A | 10/2002 |
| JP | 2002-333618 A | 11/2002 |
| JP | 2002-351353 | 12/2002 |

* cited by examiner

RESIN SHEET, LIQUID CRYSTAL CELL SUBSTRATE COMPRISING THE SAME This application is a 371 of PCT/JP03/06372, filed May 22, 2003.

TECHNICAL FIELD

The present invention relates to a resin sheet, specifically, a resin sheet that is useful for a liquid crystal cell substrate, and a liquid crystal cell substrate using the same.

BACKGROUND ART

Conventionally, in liquid crystal displays, as a liquid crystal cell substrate for supporting a liquid crystal to form a liquid crystal cell, glass-based substrates have been used from the viewpoints of their strength and heat resistance. However, in recent years, the upsizing of liquid crystal displays has created a demand for, for example, a reduction in the weight and thickness of the liquid crystal cell substrate. With respect to this demand, as an alternative material to the glass-based substrates, a resin sheet formed from an epoxy resin or the like has been proposed and commercialized (for example, see JP 6(1994)-337408 A, JP 7(1995)-199165 A). Further, for EL displays and the like, with the same background as above, the application of a resin sheet as described above also has been proposed.

However, in such a resin sheet formed from an epoxy resin or the like, shrinkage and expansion due to the influence of thermal expansion and moisture may be caused. This has led to the problem of positional deviation caused, for example, when forming an electrode and when forming a color filter. In order to avoid this problem, an attempt has been made in which spherical inorganic oxide particles having a mean particle diameter of about 1 nm to 100 μm are dispersed in the resin sheet so that the coefficient of linear expansion is suppressed to not more than $5.00 \times 10^{-5}/°C$. (for example, see JP2002-351353 A). However, the above-described resin sheet in which the spherical inorganic oxide particles are dispersed is decreased in strength. Therefore, for example, during transport or when forming a liquid crystal panel, cracking or the like is caused, which has been problematic in terms of production efficiency.

DISCLOSURE OF THE INVENTION

In order to solve the above-mentioned problems, it is an object of the present invention to provide a resin sheet that is unaffected by heat and has excellent strength and transparency. More specifically, this invention provides a resin sheet that is useful for a substrate for various types of displays such as a liquid crystal display and the like and a solar cell and the like.

In order to achieve the above-described object, the resin sheet according to the present invention is characterized by including an epoxy resin and a glass fiber cloth-like material and having a haze value of 10% or lower.

By including the glass fiber cloth-like material as described above, the resin sheet according to the present invention not only can achieve a low coefficient of linear expansion but also combines excellent strength and flexibility (bending properties). As described above, the resin sheet has a low coefficient of linear expansion, and thus, for example, when the resin sheet is used as a liquid crystal cell substrate in forming a liquid crystal panel, the above-described thermal expansion can be suppressed, and positional deviation of an electrode and a color filter that is attributable to the thermal expansion also can be avoided. Further, the resin sheet has excellent strength and flexibility, and thus, for example, cracking of the resin sheet due to vibrations caused during transport also can be prevented. Moreover, the resin sheet according to the present invention has a haze value of 10% or lower and thus has excellent transparency. Therefore, for example, when used as a liquid crystal cell substrate, an EL device substrate or the like in assembling various types of image displays, the resin sheet allows characters and images to be displayed with higher definition and thus is useful in achieving an extremely high displaying quality. Further, having a haze value of 10% or lower, the resin sheet according to the present invention is particularly useful as, for example, a transmission-type liquid crystal cell substrate.

In the present invention, the haze value can be measured based on, for example, JIS K 7136. Specifically, the measurement can be performed using a commercially available hazemeter (for example, HM-150, a trade name, manufactured by Murakami Color Research Laboratory). This measuring method is used only to determine the haze value of the above-described resin sheet and not to limit the present invention in terms of the method of manufacturing the resin sheet, the use of the resin sheet and the like.

The resin sheet according to the present invention attains the above-described effects and thus is useful as various types of substrates such as a liquid crystal cell substrate, an electroluminescent (EL) substrate, a substrate for a solar cell and the like.

BEST MODE FOR CARRYING OUT THE INVENTION

Figure 1:
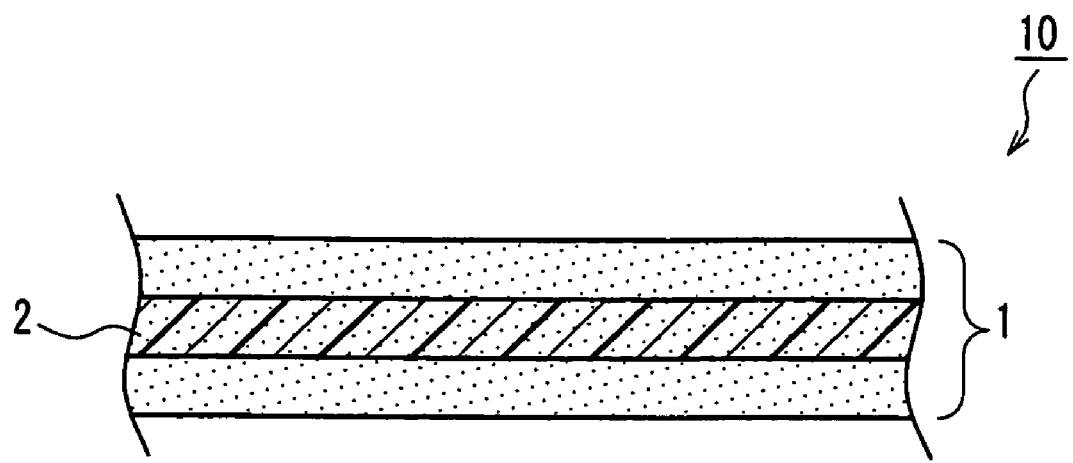
FIG. 1 is a cross-sectional view showing an example of a resin sheet according to the present invention.

As described above, the resin sheet according to the present invention is characterized by including an epoxy resin and a glass fiber cloth-like material and having a haze value of 10% or lower.

In the present invention, as the "glass fiber cloth-like material", for example, a woven fabric, a nonwoven fabric, and a knitted fabric can be used. Specifically, for example, conventionally known products available on the market such as a glass cloth woven from yarn, a glass nonwoven fabric, a roving cloth, a chopped strand mat, a unidirectional woven roving (cord fabric) and the like can be used.

The glass fiber cloth-like material has, for example, a density (weight) in a range of, preferably 10 to 500 g/m², more preferably 20 to 350 g/m², and most preferably 30 to 250 g/m². Further, the glass fiber has a filament thickness of, for example, 3 to 15 μm, preferably 5 to 13 μm, and most preferably 5 to 10 μm.

The glass fiber cloth-like material has a thickness of, for example, 10 to 500 μm, preferably 15 to 350 μm, and most preferably 30 to 250 μm.

There is no particular limit to the embodiment of the resin sheet according to the present invention as long as the epoxy resin and the glass fiber cloth-like material are included therein. For example, preferably, the resin sheet includes the glass fiber cloth-like material and a resin layer containing the epoxy resin, and is a single-layered body into which the resin layer and the glass fiber cloth-like material are integrated. Specifically, for example, preferably, the resin layer is formed of the epoxy resin that is cured in the state of being impregnated into the glass fiber cloth-like material. In a more preferable embodiment of the resin sheet, the glass fiber cloth-like material is embedded in the resin layer containing the epoxy resin. In the present invention, the epoxy resin layer refers to a layer made up of a cured body containing an epoxy resin, and may contain as well as the epoxy resin, for example, various additives such as, for example, a curing agent that will be described later.

The cross-sectional view of FIG. 1 shows an example of a preferred embodiment of the resin sheet according to the present invention. This resin sheet 10 is a single-layered body into which an epoxy resin and a glass fiber cloth-like material are integrated. A glass fiber cloth-like material 2 is embedded inside an epoxy resin layer 1. The epoxy resin is impregnated inside the glass fiber cloth-like material 2 and cured, so that the epoxy resin and the glass fiber cloth-like material 2 are integrated. In the figure, "dots" are used to show the epoxy resin.

There is no particular limit to the epoxy resin, and conventionally known types of epoxy resins can be used. Examples of such epoxy resins include: bisphenol resins such as a bisphenol A type, a bisphenol F type, a bisphenol S type, and hydrogenated derivatives thereof and the like; novolak resins such as a phenol novolak type, a cresol novolak type and the like; nitrogen-containing cyclic resins such as a triglycidylisocyanurate type, a hydantoin type and the like; aromatic resins such as an alicyclic type, an aliphatic type, a naphthalene type and the like; low-water absorptive resins such as a glycidyl ether type, a biphenyl type and the like; dicyclo resins such as a dicyclopentadiene type and the like; ester resins; ether ester resins; and modifications thereof. Among the above-mentioned types of epoxy resins, the bisphenol A type epoxy resin, the alicyclic epoxy resin, the triglycidylisocyanurate type epoxy resin, and the dicyclopentadiene type epoxy resin are used preferably from the viewpoints of prevention of discoloration and the like. These types of epoxy resins may be used alone or in the form of a combination of two or more types. The bisphenol A type epoxy resin is expressed by, for example, the following formula (1), in which n denotes, for example, 0 to 2.

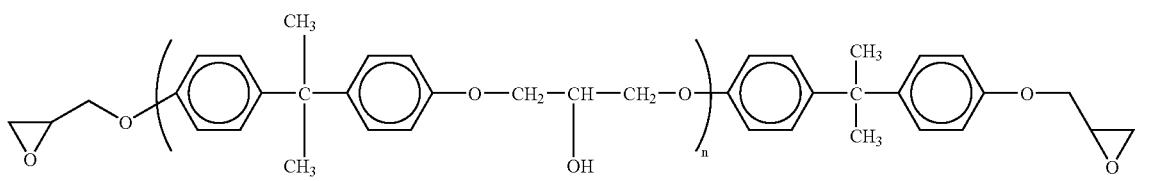

(1)

These types of epoxy resins may be used alone or in the form of a combination of two or more types. Particularly, it is preferable to use the dicyclopentadiene type epoxy resin and the alicyclic epoxy resin in combination because this combination provides heat resistance and toughness in excellent balance.

Specific examples of the alicyclic epoxy resin include 3,4-epoxycyclohexylmethyl-3,4-epoxycyclohexane carboxylate that is expressed by the following formula (2), and a compound expressed by the following formula (3). In the following formula (3), n denotes an integer of 1 to 20, and R denotes an alkyl group.

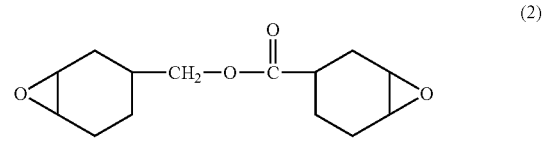

(2)

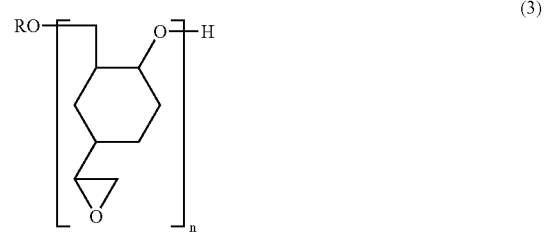

(3)

Furthermore, as the epoxy resin, an epoxy resin having a dicyclopentadiene skeleton, specifically, for example, epoxy resins that are expressed by the following formulae (4) and (5) can be used. In the following formula (5), n denotes 1 to 3.

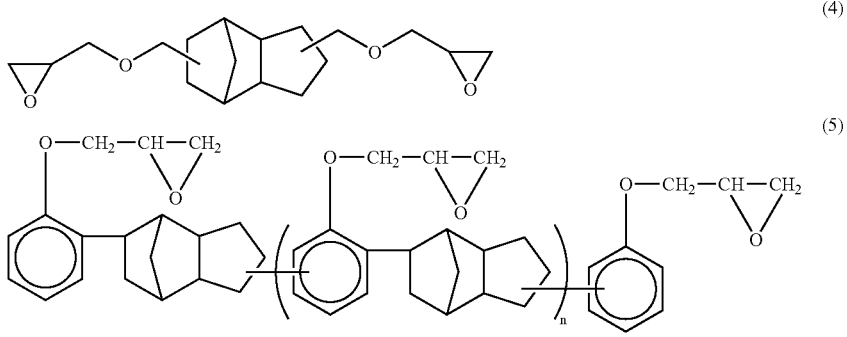

(4)

(5)

Among these types of epoxy resins, the epoxy resin expressed by the above-mentioned formula (4) or (5) is used most preferably for the following reason. That is, by the use of these resins, particularly, the resin sheet can be controlled so as to have a small retardation value in the thickness direction. In the case where a retardation in the thickness direction is small as described above, as will be described later, for example, when the resin sheet according to the present invention is used in a liquid crystal display, light leakage from a diagonal direction during a black display can be suppressed sufficiently, and thus the display properties further are enhanced.

For example, in order to form a resin sheet having increased flexibility, strength and the like, the epoxy resin has, preferably an epoxy equivalent of 100 to 1,000 (g/eq) and a softening point of 120° C. or lower, and more preferably an epoxy equivalent of 150 to 500 (g/eq) and a softening point of 80° C. or lower. Further, it is preferable that the epoxy resin is in liquid form at an atmospheric temperature (for example, 5 to 35° C.).

Furthermore, when forming the resin sheet according to the present invention as will be described later, a two-pack mixing type epoxy resin, which is in a liquid state at a temperature not higher than a temperature at which coating is performed, particularly, at an atmospheric temperature, exhibits excellent expandability and coating properties and thus is used preferably.

In the resin sheet according to the present invention, the resin layer containing the epoxy resin constitutes, for example, 20 to 80 wt %, preferably 25 to 75 wt %, and more preferably 30 to 70 wt %. Further, in the resin layer, the epoxy resin constitutes, for example, 30 to 100 wt %, preferably 40 to 90 wt %, and more preferably 40 to 80 wt %. Meanwhile, in the resin sheet, the glass fiber cloth-like material is included at a ratio of, for example, 20 to 80 wt %, preferably 25 to 75 wt %, and more preferably 30 to 70 wt %.

The epoxy resin layer may contain, for example, various additives as required, examples of which include conventionally known additives such as a curing agent, a curing accelerator, an antioxidant, a denaturant, a surfactant, a dye, a pigment, a discoloration inhibitor, an ultraviolet absorber and the like. For example, any one of these additives may be added, or these additives may be used in the form of a combination of two or more types.

There is no particular limit to the curing agent. Examples of the curing agent include organic acid compounds such as tetrahydrophthalic acid, methyltetrahydrophthalic acid, hexahydrophthalic acid, methylhexahydrophthalic acid and the like, and amine compounds such as ethylenediamine, propylenediamine, diethylenetriamine, triethylenetetramine, amine adducts thereof, methaphenylenediamine, diaminodiphenylmethane, and diaminodiphenylsulfone and the like. For example, any one of these curing agents may be used, or these curing agents may be used in the form of a combination of two or more types.

Furthermore, in addition to the above-mentioned curing agents, further examples of the curing agent include amide compounds such as dicyandiamide, polyamide and the like, hydrazide compounds such as dihydrazide and the like, imidazole compounds such as methylimidazole, 2-ethyl-4-methylimidazole, ethylimidazole, isopropylimidazole, 2,4-dimethylimidazole, phenylimidazole, undecylimidazole, heptadecylimidazole, 2-phenyl-4-methylimidazole and the like, imidazoline compounds such as methylimidazoline, 2-ethyl-4-methylimidazoline, ethylimidazoline, isopropylimidazoline, 2,4-dimethyl-imidazoline, phenylimidazoline, undecylimidazoline, heptadecylimidazoline, 2-phenyl-4-methylimidazoline and the like, phenol compounds, urea compounds, and polysulfide compounds.

Moreover, acid anhydrides and the like also can be used as the curing agent and are preferable from the viewpoints of, for example, prevention of discoloration and the like. Specific examples of an acid anhydride include phthalic anhydride, maleic anhydride, trimellitic anhydride, pyromellitic anhydride, nadic anhydride, glutaric anhydride, tetrahydrophthalic anhydride, methyltetrahydrophthalic anhydride, hexahydrophthalic anhydride, methylhexahydrophthalic anhydride, methylnadic anhydride, dodecenylsuccinic anhydride, dichlorosuccinic anhydride, benzophenonetetracarboxylic anhydride, and chlorendic anhydride. Of these acid anhydrides, particularly, colorless or pale yellow acid anhydrides having a molecular weight of about 140 to about 200 are used preferably. Examples of such acid anhydrides include phthalic anhydride, tetrahydrophthalic anhydride, hexahydrophthalic anhydride, methylhexahydrophthalic anhydride, and methylnadic anhydride.

There is no particular limit to the proportion in which the epoxy resin and the curing agent are mixed. In the case of using an acid anhydride-based curing agent as the curing agent, for example, an acid anhydride is mixed so as to attain, preferably 0.5 to 1.5 equivalents, and more preferably 0.7 to 1.2 equivalents, per equivalent of an epoxy group in an epoxy resin. With the acid anhydride mixed in an amount of not less than 0.5 equivalents, a further improvement in color tint is obtained after curing, and with the acid anhydride mixed in an amount of not more than 1.5 equivalents, sufficient moisture resistance can be maintained. In the cases of using other curing agents and in the case of using one or more types of curing agents in combination, mixing also can be performed according to, for example, the above-mentioned proportions.

There is no particular limit to the curing accelerator, and, for example, tertiary amines, imidazoles, quaternary ammonium salts, quaternary phosphonium salts, organic metal salts, phosphorus compounds, and urea compounds and the like can be used. Among these compounds, particularly, tertiary amines, imidazoles, and quaternary phosphonium salts are used preferably. For example, these curing accelerators may be used alone or in the form of a combination of two or more types.

There is no particular limit to the proportion in which the curing accelerator is mixed, and the proportion can be determined appropriately according to, for example, the amount and type of an epoxy resin. Specifically, for example, a curing accelerator is in an amount, preferably of 0.05 to 7.0 parts by weight, and more preferably in a range of 0.2 to 3.0 parts by weight, per 100 parts by weight of an epoxy resin. With the curing accelerator mixed in an amount of not less than 0.05 parts by weight, an effect of accelerating curing can be attained sufficiently, and with the curing accelerator mixed in an amount of not more than 7.0 parts by weight, a further improvement in color tint is obtained after curing.

There is no particular limit to the antioxidant, and, for example, conventionally known compounds such as phenols, amines, organosulfur compounds, phosphines and the like can be used.

There is no particular limit to the denaturant, and, for example, conventionally known compounds such as glycols, silicones, alcohols and the like can be used.

There is no particular limit to the addition of the surfactant. For example, when forming an epoxy resin sheet by allowing an epoxy resin to be cured while being in contact with air, the surfactant can be added so that the sheet has a smooth surface. As the surfactant, for example, various surfactants such as silicone, acrylic, and fluorinated surfactants and the like can be used, and among these surfactants, the silicone surfactants are used preferably.

The resin sheet according to the present invention may be a single-layered body including the epoxy resin and the glass fiber cloth-like material, namely, a single epoxy resin layer with the glass fiber cloth-like material included therein, or a laminated body in which, in addition to the single-layered body, other sheets that will be described later are laminated.

In the resin sheet according to the present invention, an absolute value of a difference between a refractive index of the glass fiber cloth-like material and a refractive index of the resin layer containing the epoxy resin is, preferably 0 to 0.01, more preferably 0 to 0.008, and most preferably 0 to 0.006 for the following reason. That is, with the absolute value being not more than 0.01, interface scattering caused between the glass fiber cloth-like material and the resin layer can be suppressed sufficiently, and the haze value of the resin sheet can be decreased, thereby allowing sufficient transparency to be maintained. In the present invention, the refractive indexes can be determined by, for example, measurement using an Abbe refractometer performed under a condition of a temperature of 25° C. and light with a wavelength of 589 nm. In this relationship between the respective refractive indexes, the resin layer containing the epoxy resin refers to, for example, a cured body constituting a portion of the resin sheet except for the glass fiber cloth-like material.

It is preferable that the resin sheet according to the present invention has a coefficient of linear expansion of not more than $3.00 \times 10^{-5}/°$ C. at a temperature of 25° C. to 160° C. for the following reason. That is, with a coefficient of linear expansion not more than the above-mentioned value, in the case where the resin sheet according to the present invention is used as a liquid crystal cell substrate, and a color filter and an electrode are formed on the surface thereof, positional deviation and the like attributable to thermal expansion can be suppressed sufficiently, and thus the process of forming the color filter or the like further is facilitated. Further, the coefficient of linear expansion is, more preferably not more than $2.00 \times 10^{-5}/°$ C., and most preferably 0 to $1.5 \times 10^{-5}/°$ C.

The coefficient of linear expansion can be determined, for example, in the following manner. That is, with respect to a sample, a TMA measured value is obtained by the TMA method specified in JIS K-7197 and is substituted into the following expression. In the following expression, $\Delta Is(T_1)$ and $\Delta Is(T_2)$ indicate TMA measured values (μm) obtained respectively at a temperature $T_1$ (° C.) and a temperature $T_2$ (° C.), at which the measurement was performed with respect to the sample, and $L_0$ indicates a length (mm) of the sample at a room temperature of 23° C.

Coefficient of linear expansion=$[1/(L_0 \times 10^3)] \cdot [(\Delta Is(T_2) - \Delta Is(T_1))/(T_2 - T_1)]$ The resin sheet according to the present invention has a haze value of, suitably 10% or lower as described above, more preferably 3% or lower, and most preferably 0 to 2%.

It is preferable that the resin sheet according to the present invention has a light transmittance of 88% or higher for the following reason. That is, with a light transmittance not lower than the above-mentioned value, for example, when the resin sheet is used as a liquid crystal cell substrate, an EL device substrate or the like in assembling various types of image displays, characters and images can be displayed with higher definition, thereby achieving a higher displaying quality. Further, the light transmittance is, more preferably 90% or higher, and most preferably 92 to 100%. The light transmittance can be determined by, for example, measuring a total transmittance of light rays with a wavelength of 550 nm using a high-speed spectrophotometer.

It is preferable that the resin sheet according to the present invention has an in-plane retardation of not more than 2 nm for the following reason. That is, with an in-plane retardation not more than the above-mentioned value, when the resin sheet is used as a liquid crystal cell substrate, an EL device substrate or the like, the contrast, particularly, the contrast in an oblique direction of an image display is improved further, and thus an excellent displaying quality is exhibited. Further, the in-plane retardation is, more preferably 0 to 1 nm, and most preferably 0 to 0.8 nm.

Furthermore, preferably, the resin sheet according to the present invention has a retardation in the thickness direction of not more than 40 nm for the following reason. That is, with a retardation in the thickness direction of not more than the above-mentioned value, when the resin sheet is used in an image display as described above, light leakage from an oblique direction can be suppressed sufficiently, and the contrast in the oblique direction is improved further, and thus an excellent displaying quality is exhibited. The retardation in the thickness direction is, more preferably not more than 20 nm, even more preferably 0 to 10 nm, and still more preferably 0 to 7 nm. In the case where the retardation in the thickness direction is set to a value not more than 40 nm, particularly, not more than 20 nm, it is most preferable to use the epoxy resin expressed by the above-mentioned formula (4) or (5).

The above-mentioned in-plane retardation (Δnd) and the retardation in the thickness direction (Rth) are expressed respectively by, for example, the following expressions. In the following expressions, nx, ny, and nz indicate the respective refractive indexes in directions of an X axis, a Y axis, and a Z axis in the resin sheet. The X axis direction refers to an axis direction in which the resin sheet has the maximum refractive index in the plane thereof. The Y axis direction refers to an axis direction perpendicular to the X axis in the plane. The Z axis direction refers to a thickness direction perpendicular to the X axis and the Y axis. Further, d indicates the thickness of the resin sheet.

$$\Delta nd=(nx-ny)\cdot d$$

$$Rth=[\{(nx+ny)/2\}-nz]\cdot d$$

Preferably, in the resin sheet according to the present invention, at least one surface of the resin sheet is smooth for the following reason. That is, by forming the surface so that it is smooth as described above, for example, when the resin sheet is used as a liquid crystal cell substrate, the process of forming an alignment film, a transparent electrode or the like on the surface further is facilitated. Specifically, preferably, the at least one surface has a surface roughness (Rt) of, for example, not more than 2 μm. In the present invention, a "surface roughness" refers to a difference between a maximum value and a minimum value that are obtained by measurement using a stylus type surface roughness meter (for example, P-11, trade name; manufactured by KLA-Tencor Japan Ltd.) under a condition of a long wavelength cut-off of 800 μm, a short wavelength cut-off of 250 μm, and an evaluation length of 10 mm.

In the case where the resin sheet according to the present invention is the single-layered body, there is no particular limit to the thickness of the resin sheet. Preferably, in this case, the resin sheet has a thickness in a range of, for example, 20 to 800 μm for the following reason. That is, with the thickness being not less than 20 μm, sufficient strength and rigidity can be maintained. Further, with the thickness being not more than 800 μm, for example, a thickness and weight reduction can be realized sufficiently. The thickness is, more preferably 30 to 500 μm, and most preferably 50 to 300 μm.

The resin sheet according to the present invention may be a laminated body further including, in addition to the single-layered body described above, at least one of a hard-coat layer and a gas barrier layer. Preferably, the resin sheet is a laminated body including both of the hard-coat layer and the gas barrier layer. Particularly, with the hard-coat layer laminated as an outermost layer, for example, the abrasion resistance and the like of the sheet can be increased. Further, in each of various types of image displays such as a liquid crystal display and the like, when moisture and oxygen are transmitted through a liquid crystal cell substrate to enter a liquid crystal cell, the quality of a liquid crystal changes and bubbles are formed, which may cause deterioration in appearance, disconnection of a conductive film pattern, and the like. However, by providing the gas barrier layer, for example, the transmission of moisture, oxygen and the like through gas can be prevented. Further, each of the hard-coat layer and the gas barrier layer may be laminated on either one or each of surfaces.

Figure 2:
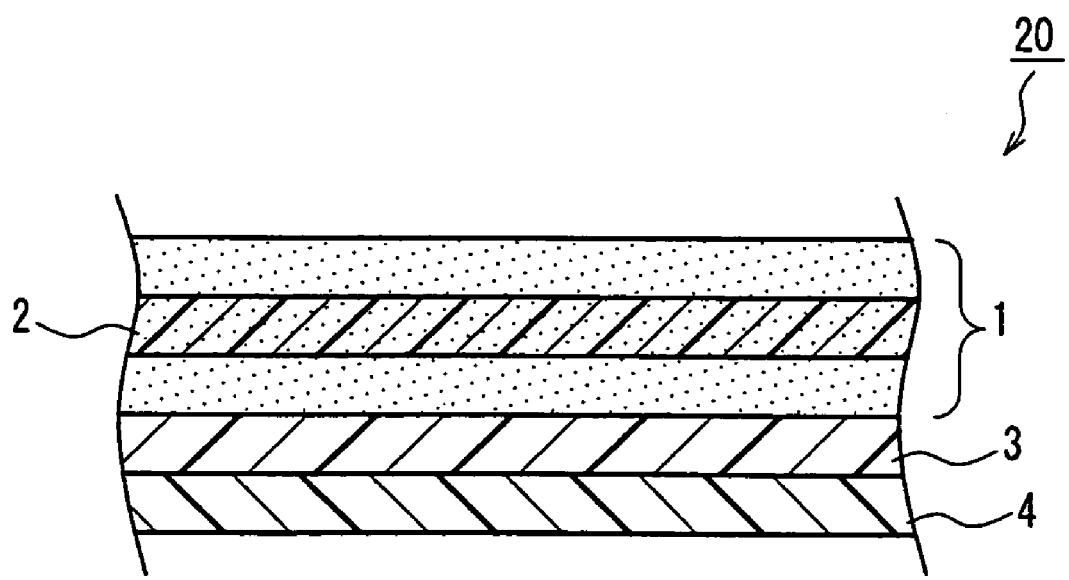
FIG. 2 is cross-sectional view showing another example of the resin sheet according to the present invention.

In the case of including both of the hard-coat layer and the gas barrier layer, there is no particular limit to the order of layer lamination. Preferably, in this case, the order of layer lamination is the epoxy resin layer, the gas barrier layer, and the hard-coat layer. Particularly, the hard-coat layer has excellent impact resistance, chemical resistance and the like and thus preferably is laminated as an outermost layer. Further, another hard-coat layer may be laminated also on the other surface of the epoxy resin layer. The cross-sectional view of FIG. 2 shows an example of the resin sheet according to the present invention, which includes a hard-coat layer and a gas barrier layer as described above. In the figure, like portions are identified by the same reference numerals as in FIG. 1. As shown in the figure, in this resin sheet 20, a gas barrier layer 3 is laminated on one surface of an epoxy resin layer 1 containing a glass fiber cloth-like material 2, and a hard-coat layer 4 is laminated further on the gas barrier layer 3.

There is no particular limit to a material for forming the hard-coat layer. Examples of the material include urethane resins, acrylic resins, polyester resins, polyvinyl alcohol resins such as polyvinyl alcohol, an ethylene vinyl alcohol copolymer and the like, vinyl chloride resins, and vinylidene chloride resins. Further, for example, polyarylate resins, sulfone resins, amide resins, imide resins, polyether sulfone resins, polyether imide resins, polycarbonate resins, silicone resins, fluororesins, polyolefin resins, styrene resins, vinylpyrrolidone resins, cellulose resins, acrylonitrile resins and the like also can be used. Among these materials, urethane resins are used preferably, and more preferably, urethane acrylate is used. These types of resins may be used alone or in the form of a blend of two or more types.

There is no particular limit to the thickness of the hard-coat layer. In general, from the viewpoints of prevention of peeling that may be caused during production and cracking entailed by peeling, the hard-coat layer has a thickness, for example, suitably in a range of 0.1 to 50 μm, preferably in a range of 0.5 to 8 μm, and more preferably in a range of 2 to 5 μm.

The gas barrier layer is categorized into, for example, an organic gas barrier layer and an inorganic gas barrier layer. There is no particular limit to a material for forming the organic gas barrier layer. For example, materials with low oxygen-permeability including polyvinyl alcohol and a partially saponified product thereof, vinyl alcohol polymers such as ethylene vinyl alcohol copolymer and the like, polyacrylonitrile, polyvinylidene chloride and the like can be used. Among these materials, vinyl alcohol polymers are used most preferably from the viewpoint of their high gas barrier properties.

From the viewpoints of, for example, functionality in terms of transparency, prevention of coloration, gas barrier properties and the like, a reduction in thickness, flexibility of a resulting resin sheet and the like, the thickness of the organic gas barrier layer is, preferably not more than 10 μm, more preferably in a range of 2 to 10 μm, and most preferably in a range of 3 to 5 μm. With the thickness being not more than 10 μm, in the resin sheet, a lower yellow color index (YI value) can be maintained, and with the thickness being not less than 2 μm, a sufficient gas barrier function can be maintained.

Meanwhile, as a material for forming the inorganic gas barrier layer, for example, transparent materials such as silicon oxides, magnesium oxides, aluminum oxides, zinc oxides and the like can be used. Among these materials, silicon oxides and silicon nitrides are used preferably from the viewpoints of, for example, their excellent gas barrier properties, adhesion to a base material layer and the like.

Preferably, the silicon oxides have, for example, a ratio of the number of oxygen atoms to the number of silicon atoms of 1.5 to 2.0 for the following reason. That is, with this ratio, the inorganic gas barrier layer is improved further in terms of, for example, gas barrier properties, transparency, surface flatness, bending properties, membrane stress, cost, and the like. The silicon oxides have a maximum ratio of the number of oxygen atoms to the number of silicon atoms of 2.0.

Preferably, the silicon nitrides have, for example, a ratio (Si:N) of the number of nitrogen atoms (N) to the number of silicon atoms (Si) of 1:1 to 3:4.

There is no particular limit to the thickness of the inorganic gas barrier layer. Preferably, the inorganic gas barrier layer has a thickness in a range of, for example, 5 to 200 nm. With the thickness being not less than 5 nm, for example, more excellent gas barrier properties can be obtained, and with the thickness being not more than 200 nm, the inorganic gas barrier layer is improved also in terms of transparency, bending properties, membrane stress, and cost.

In the case where the resin sheet according to the present invention is the laminated body as described above, the thickness of the resin sheet varies depending on the number of layers in the lamination. In this case, the resin sheet has a thickness, for example, preferably in a range of 20 to 800 μm, more preferably in a range of 30 to 500 μm, and most preferably in a range of 50 to 300 μm. In the case of the above-mentioned laminated body, the laminated body may include one layer containing the epoxy resin and the glass fiber cloth-like material or two or more such layers.

There is no particular limit to a method of manufacturing the above-described resin sheet according to the present invention. The resin sheet can be formed by, for example, the following method. That is, the epoxy resin is solidified in the presence of the glass fiber cloth-like material. In this case, for example, conventionally known methods such as a casting method, a flow-expanding method, an impregnating method, a coating method and the like can be employed. Specifically, the manufacturing of the resin sheet can be performed as follows.

In the case of the casting method, for example, a glass fiber cloth-like material is placed on a flat plate mold, and a liquid epoxy resin is coated on the cloth-like material. Then, by setting a condition of a reduced pressure, the cloth-like material is impregnated with the epoxy resin. After that, for example, by a heating treatment or UV irradiation, the epoxy resin is cured, and thus an epoxy resin layer containing the glass fiber cloth-like material can be formed.

Furthermore, even under the condition of an atmospheric pressure, an epoxy resin layer containing the glass fiber cloth-like material also can be formed by the following method. That is, the glass fiber cloth-like material is dipped into a liquid epoxy resin by the impregnating method, and the epoxy resin is cured in that state. Further, alternatively, the epoxy resin layer may be formed by a method in which the glass fiber cloth-like material is placed on an endless belt or a substrate, and the epoxy resin is impregnated thereinto or coated thereon.

Furthermore, as required, the coated epoxy resin may be cured by, for example, a heating treatment, a light irradiating treatment or the like. There is no particular limit to a condition for curing an epoxy resin containing the dicyclopentadiene type epoxy resin. Preferably, for example, the curing is performed at a temperature of 100 to 200° C. for ten minutes to five hours.

The epoxy resin may be used, for example, in the form of an epoxy resin solution prepared by dispersing or dissolving the epoxy resin in a solvent. There is no particular limit to the solvent. For example, methyl ethyl ketone, acetone, methyl isobutyl ketone, toluene, xylene, ethyl acetate and the like can be used. The above-mentioned resins of the other types and various additives can be added appropriately to a liquid epoxy resin and an epoxy resin solution in which the epoxy resin is dissolved in a solvent.

Furthermore, in the case where the resin sheet according to the present invention is a laminated body including a hard-coat layer and the like, the resin sheet should be formed by, for example, the following method. That is, after a hard-coat layer is formed on the flat plate mold, the glass fiber cloth-like material is placed on the hard-coat layer, and an epoxy resin layer is formed in the same manner as described above. In forming the hard-coat layer, as required, curing may be performed by a heating treatment, a light irradiating treatment or the like. Further, in another possible method, a hard-coat layer is formed on an endless belt or a base material that is formed from stainless steel or the like by the flow-expanding method, the coating method or the like, and then an epoxy resin layer containing the glass fiber cloth-like material is bonded to the hard-coat layer.

There is no particular limit to a method of forming the hard-coat layer. The hard-coat layer should be formed by a method in which a coating solution is prepared by mixing the above-mentioned materials into the solvent, coated on a base material and dried. There is no particular limit to the coating method, and for example, conventionally known methods such as a roll coating method, a spin coating method, a wire bar coating method, a dip coating method, an extrusion method, a curtain coating method, a spray coating method and the like can be employed.

Furthermore, in the case of a resin sheet including a gas barrier layer, the resin sheet should be formed by, for example, the following method. That is, a gas barrier layer is formed on a hard-coat layer formed as described above, and then an epoxy resin layer containing a glass fiber cloth-like material is formed in the same manner as described above. There is no particular limit to a method of forming the gas barrier layer, and for example, conventionally known methods can be employed appropriately.

The resin sheet according to the present invention can be used for various applications. Advantageously, the resin sheet also can be used as a liquid crystal cell substrate, a substrate for an EL display, and a substrate for a solar cell, for example. In the case of using the resin sheet as any of various types of substrates as described above, for example, the resin sheet may be used in the same manner as in the case of using a conventionally used transparent substrate such as a glass substrate or the like.

Furthermore, the resin sheet according to the present invention can be used as a liquid crystal cell substrate in a liquid crystal cell or a liquid crystal display, as a substrate for an EL display in an EL display, and as a substrate for a solar cell in a solar cell or the like. The various types of substrates can be used as, for example, substitutes for glass substrates and the like used in various types of conventional displays and solar cells. Through the use of the various types of substrates according to the present invention, for example, sufficient strength can be maintained, and a thickness and weight reduction can be realized. There is no limit to the above-mentioned liquid crystal cells, various types of image displays, solar cells and the like except that the resin sheet according to the present invention is used as a substrate. Constituent members other than the substrate and their structures can be the same as in the conventional case.

Generally, a liquid crystal display includes a liquid crystal cell in which a liquid crystal is held by a liquid crystal cell substrate having an electrode, a polarizing plate, a reflector, and a backlight, and a driving circuit and the like are incorporated therein. In the liquid crystal display according to the present invention, the resin sheet according to the present invention may be used as a liquid crystal cell substrate. Except for this, there is no particular limit to the liquid crystal display, and the liquid crystal display further may include various types of conventionally known constituent components. Thus, in the liquid crystal display according to the present invention, the liquid crystal cell substrate according to the present invention further may be combined with, for example, optical components or the like such as a light diffusion plate to be provided on a polarizing plate on a visible side, an anti-glare layer, a reflection preventing film, a protective layer, a protective plate, or a retardation plate for compensation that is to be provided between a liquid crystal cell and a polarizing plate on the visible side or the like.

Generally, an electroluminescent display is configured with a transparent substrate (substrate for EL display) on which a transparent electrode, an organic ruminant layer containing a luminant (organic electroluminescent ruminant), and a metal electrode are laminated in this order. In an EL display according to the present invention, the resin sheet according to the present invention should be used as a substrate for EL display. Except for this, there is no particular limit to the EL display, and the EL display further may include various types of conventionally known constituent components.

The organic luminant layer is a laminated body formed of organic thin films containing various types of ruminants. Examples of such a laminated body include: a laminated body of a hole injection layer containing a triphenylamine derivative or the like and a ruminant layer made of a phosphorous organic solid such as anthracene or the like; a laminated body of the above-mentioned luminant layer and an electron injection layer containing a perylene derivative or the like; and a laminated body of the above-mentioned hole injection layer, luminant layer, and electron injection layer, and various such combinations are known.

In general, an organic electroluminescent display emits light on the principle that a voltage is applied to each of the transparent electrode and the metal electrode so as to inject holes and electrons into the organic luminant layer, energy generated by re-bonding of these holes and electrons excites the liminant such as a phosphor or the like, and the excited phosphor radiates the light when it returns to the basis state. The mechanism of the re-bonding that occurs in the course of this process is the same as in the case of an ordinary diode. As also can be anticipated by this, current and light emitting intensity exhibit considerable nonlinearity accompanied with rectification with respect to the applied voltage.

It is necessary for an organic electroluminescent device that at least one of the electrodes be transparent so as to obtain luminescence at the organic luminant layer. In general, a transparent electrode formed of a transparent conductive material such as indium tin oxide (ITO) is used for an anode. Meanwhile, the use of substances having small work function for a cathode is important in order to facilitate electron injection thereby to raise luminous efficiency, and in general, metal electrodes such as Mg—Ag, Al—Li, and the like are used.

In an organic electroluminescent device configured as described above, it is preferable that the organic luminant layer is made of a film that is as extremely thin as about 10 nm. With this small thickness, for example, the organic luminant layer can transmit substantially whole light as the transparent electrode does. As a result, when no light is emitted, light that has entered from the surface of the transparent substrate, passed through the transparent electrode and the organic luminant layer, and then been reflected at the metal electrode comes out again to the surface side of the transparent substrate. Because of this, the display surface of the organic electroluminescent display looks like a mirror when viewed from the exterior.

In the case where the EL device according to the present invention is, for example, an organic EL device that includes a transparent electrode on the surface side of an organic luminant layer that emits light by the application of a voltage, and a metal electrode on the backside of the organic luminant layer, it is preferable that a polarizing plate is provided on the surface side of the transparent electrode, and a retardation plate is provided between the transparent electrode and the polarizing plate.

The retardation plate and the polarizing plate have a function of polarizing light that has entered from the exterior and then been reflected by the metal electrode, thereby providing an effect that the mirror of the metal electrode cannot be viewed from the exterior by the polarizing function. Particularly, the mirror of the metal electrode can be blocked completely by using a quarter wavelength plate as the retardation plate and adjusting an angle formed by the polarization direction of the polarizing plate and the retardation plate to be $\pi/4$. That is, of external light entering the organic EL device, only a linearly polarized component can be transmitted by the polarizing plate. Generally, the linearly polarized component of the light is turned into elliptically polarized light by the retardation plate. Particularly, when the retardation plate is a quarter wavelength plate and when the angle of the polarization direction provided by the polarizing plate and the retardation plate is $\pi/4$, the linearly polarized component is turned into circularly polarized light. The circularly polarized light passes through the transparent substrate, the transparent electrode, and the organic thin films. After being reflected by the metal electrode, the light passes again through the organic thin films, the transparent electrode, and the transparent substrate, and is turned again into linearly polarized light by the retardation plate. Since the linearly polarized light crosses the polarization direction of the polarizing plate at a right angle, it cannot pass through the polarizing plate. As a result, the mirror of the metal electrode can be blocked completely.

EXAMPLES

Hereinafter, the present invention will be described by way of examples with no intention to limit the invention thereto.

Example 1

An epoxy resin mixture was prepared using as an epoxy resin 3,4-epoxycyclohexylmethyl-3,4-epoxycyclohexane carboxylate expressed by the above-mentioned formula (2) (27 parts by weight) and a bisphenol A type epoxy resin (AER250, trade name (epoxy equivalent of 190); manufactured by Asahi Kasei Corporation) expressed by the above-mentioned formula (1) (73 parts by weight), as a curing agent methylhexahydrophthalic anhydride expressed by the following formula (6) (88 parts by weight), and as a curing accelerator tetra-n-butylphosphonium o,o-diethylphosphorodithioate expressed by the following formula (7) (0.9 parts by weight). The preparation was performed by mixing the above-mentioned materials under stirring. Then, a glass cloth (Glass Cloth, trade name; manufactured by Nitto Boseki Co., Ltd.) having a refractive index of 1.524 and a thickness of 100 μm was dipped in the mixture and left to stand for 10 minutes under a condition of a reduced pressure (200 Pa) so that the mixture was impregnated into the glass cloth. Thus, a precursor layer in which the glass cloth was embedded was formed.

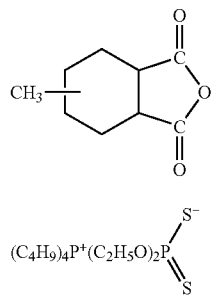

(6)

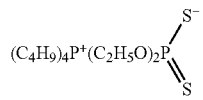

(7)

Meanwhile, a 17 wt % urethane acrylate solution was prepared by dissolving urethane acrylate expressed by the following formula (8) in toluene. Then, the urethane acrylate solution was coated by flow-expanding on a glass plate, and a resulting coating film was wind dried so that the toluene solvent was evaporated. The coating film was then cured by a UV curing device. As a curing condition, a high-pressure mercury lamp was used, and curing was performed at 200 mJ/cm² for one minute. Thus, a hard-coat layer having a thickness of 2 μm was formed on the glass plate.

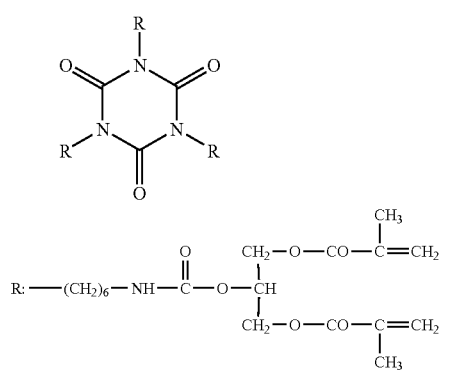

(8)

Subsequently, the precursor layer in which the glass cloth was embedded was laminated on the hard-coat layer on the glass plate, and a glass plate that has been subjected to a mold-releasing treatment further was laminated on the precursor layer. Then, a resulting laminated body was subjected to a heat treatment so that the precursor layer was cured. The curing was performed by one-hour heating at 120° C. further followed by one-hour heating at 150° C. By the curing, an epoxy resin layer containing the glass cloth was formed on the hard-coat layer. A cured body containing the epoxy resin has a refractive index of 1.530, and thus a difference in refractive index between the glass cloth and the cured body was 0.006. The refractive index of a portion of the resin layer (cured body) that contains the epoxy resin except for the glass cloth was determined separately from the manufacturing of the resin sheet. That is, in the same manner as described above except that the glass cloth is not used, the epoxy resin mixture was cured, and the refractive index of a resulting cured body was measured and used as the above-mentioned refractive index (hereinafter, the same applies).

Then, the glass plates on both surfaces are peeled off, and thus a laminated body of the hard-coat layer and the epoxy resin layer was obtained. The laminated body was placed on a stainless steel plate and subjected to after-cure in which the laminated body was left to stand for an hour in an atmosphere of 180° C. and an oxygen concentration of 0.5% that was obtained by nitrogen substitution. Thus, a resin sheet that was the laminated body of the hard-coat layer and the epoxy resin layer having the glass cloth was obtained. The resin sheet had a thickness of 110 μm.

Example 2

An epoxy resin mixture was prepared using 3,4-epoxycyclohexylmethyl-3,4-epoxycyclohexane carboxylate expressed by the above-mentioned formula (2) (78 parts by weight) and an epoxy resin expressed by the above-mentioned formula (5) in which n=0.2, as a curing agent methyl nadic acid (110 parts by weight), and as a curing accelerator tetra-n-butylphosphonium o,o-diethylphosphorodithioate expressed by the above-mentioned formula (7) (2.0 parts by weight). The preparation was performed by mixing the above-mentioned materials under stirring. Then, in the same manner as in Example 1 except that this mixture and a glass cloth (Glass Cloth, trade name; manufactured by Nitto Boseki Co., Ltd.) having a refractive index of 1.513 and a thickness of 100 μm were used, a resin sheet that was a laminated body of a hard-coat layer and an epoxy resin layer having the glass cloth was manufactured. The resin sheet had a thickness of 110 μm, and a cured body containing the epoxy resin has a refractive index of 1.514, and thus a difference in diffractive index between the glass cloth and the cured body was 0.001.

Comparative Example 1

This comparative example relates to an example of a resin sheet without a glass cloth. An epoxy resin solution that was the same as that used in Example 1 was coated by flow-expanding on a hard-coat layer that was the same as that used in Example 1 so that a precursor layer was formed thereon. The precursor layer was subjected to a heating treatment so as to be cured. The same curing condition as that used in Example 1 was used. By the curing, an epoxy resin layer having a thickness of 100 μm was formed on the hard-coat layer. Next, a laminated body of the hard-coat layer and the epoxy resin layer was peeled off of the endless belt and then subjected to after-cure under the same condition as that used in Example 1.

Comparative Example 2

This comparative example relates to an example in which glass beads are used in place of a glass cloth. In the same manner as in Comparative Example 1 except that an epoxy resin solution containing a filler was prepared by mixing 70 parts by weight of spherical glass beads having a mean particle diameter of 120 μm (refractive index: 1.524) into an epoxy resin solution that was the same as that used in Example 1, a resin sheet that was a laminated body of a hard-coat layer and an epoxy resin layer was manufactured.

Comparative Example 3

A resin sheet was manufactured in the same manner as in Example 2 except that a glass cloth (Glass Cloth, trade name; manufactured by Nitto Boseki Co., Ltd.) having a refractive index of 1.558 and a thickness of 100 μm was used as a glass cloth. A cured body containing an epoxy resin has a refractive index of 1.514, and thus a difference in refractive index between the glass cloth and the cured body was 0.044.

With respect to each of the resin sheets obtained as described above, the following evaluation tests were performed. The results thereof are shown in Table 1 below.

1. Coefficient of Linear Expansion

Using a TMA/SS150C, trade name (manufactured by Seiko Instruments Inc.), TMA values (μm) at temperatures of 25° C. and 160° C. were measured, and determination was performed in the above-mentioned manner.

2. Bending Property Test

Each of the resin sheets was wound around a steel mast having a diameter of 35 mm, and a visual observation was performed to check if a crack had been caused.

3. Light Transmittance (%)

With respect to each of the resin sheets, a total transmittance of light rays of λ=550 nm was measured using a high-speed spectrophotometer (DOT-3C, trade name; manufactured by Murakami Color Research Laboratory).

4. In-plane Retardation (Δnd) and Retardation in Thickness Direction (Rth)

With respect to each of the resin sheets, an in-plane retardation and a retardation in a thickness direction were determined based on a refractive index at 590 nm using KOBRA21ADH, trade name of Oji Scientific Instruments.

5. Surface Roughness

With respect to each of the resin sheets, a surface roughness (difference between a maximum value and a minimum value) was measured using a stylus type surface roughness meter (for example, P-11, trade name; manufactured by KLA-Tencor Japan Ltd.) under a condition of a long wavelength cut-off of 800 μm, a short wavelength cut-off of 250 μm, and an evaluation length of 10 mm. The measurement of the surface roughness was performed with respect to each of a surface on the epoxy resin layer side and a surface on the hard-coat layer side. In Table 1 below, the surface roughness of the surface on the epoxy resin layer side was indicated as "Rt(E)", and the surface roughness of the surface on the hard-coat layer side was indicated as "Rt(H)".

6. Haze Value

With respect to each of the resin sheets, a haze value was measured using a hazemeter (HM-150, trade name; manufactured by Murakami Color Research Laboratory).

TABLE 1

|  | Coefficient of linear expansion (/° C.) | Light transmittance (%) | Bending properties | Δnd (nm) | Rth (nm) | Haze value (%) | Rt (E) (μm) | Rt (H) (μm) |
|---|---|---|---|---|---|---|---|---|
| Ex. 1 | $1.8 \times 10^{-5}$ | 90 | No crack caused | 1.5 | 42 | 8 | 0.7 | 0.7 |
| Ex. 2 | $1.5 \times 10^{-5}$ | 90 | No crack caused | 0.2 | 9 | 2.5 | 0.6 | 0.6 |
| Com. Ex. 1 | $6.5 \times 10^{-5}$ | 92 | No crack caused | 0.2 | 40 | 0 | 0.02 | 0.02 |
| Com. Ex. 2 | $2.6 \times 10^{-5}$ | 89 | Crack caused | 0.2 | 40 | 10 | 0.4 | 0.4 |
| Com. Ex. 3 | $1.5 \times 10^{-5}$ | 89 | No crack caused | N.D | N.D | 83 | 0.6 | 0.6 |

N.D: Not determinable

As shown in Table 1, in the resin sheet of Comparative Example 2, since the glass beads were contained therein, while a low coefficient of linear expansion could be obtained, bending properties were deteriorated, resulting in the occurrence of a crack. Meanwhile, in Comparative Example 1 without a glass cloth, while no crack was caused, an extremely high coefficient of linear expansion was obtained. In contrast to this, in the resin sheet of Example 1, a low coefficient of linear expansion was obtained, and moreover, excellent bending properties and light transmittance also were attained. Further, in the resin sheet of Comparative Example 3, since the difference in refractive index between the glass cloth and the epoxy resin cured body was large, the resin sheet exhibited an extremely high haze value and thus could not be used as a transmission-type liquid crystal cell substrate. As explained by the foregoing description, according to the present invention, a resin sheet with a low coefficient of linear expansion can be obtained, in which cracking is not likely to occur even on impact during transport and an excellent transparency also is attained. Moreover, as shown in Example 2, through the use of an epoxy resin having the dicyclopentadiene skeleton expressed by the above-mentioned formula (5), the resin sheet that exhibited an even smaller value of Rth could be obtained.

INDUSTRIAL APPLICABILITY

As described in the foregoing discussion, the resin sheet according to the present invention includes a glass fiber cloth-like material and an epoxy resin and thus, for example, suppresses thermal expansion or the like and exhibits excellent strength. Thus, patterning deviation caused due to thermal expansion is suppressed, and moreover, rupture is not caused even on impact during transport or assembly of various types of displays such as a liquid crystal and the like, thereby also providing excellent production efficiency. In addition, the resin sheet according to the present invention has a haze value of 10% or lower. Therefore, the resin sheet has excellent transparency, and thus is useful for, for example, a transmission-type liquid crystal cell substrate. Thus, when the resin sheet according to the present invention is used as any of the various types of substrates described above, various types of displays and a solar cell that not only achieve weight and thickness reduction but also exhibit excellent strength and transparency can be obtained.

The invention claimed is:

1. A resin sheet, comprising an epoxy resin and a glass fiber cloth-like material, wherein the resin sheet comprises the glass fiber cloth-like material and a resin layer containing the epoxy resin, such that an absolute value of a difference between a refractive index of the glass fiber cloth-like material and a refractive index of the resin layer is 0 to 0.01, and wherein the resin sheet has a haze value of 10% or lower, an in-plane retardation of not more than 2 nm, and a retardation in a thickness direction of not more than 40 nm.

2. The resin sheet according to claim 1, wherein the resin sheet has a coefficient of linear expansion of not more than $3.00 \times 10^{-5}/°$ C. at a temperature of 25° C. to 160° C.

3. The resin sheet according to claim 1, wherein the resin sheet has a light transmittance of 88% or higher.

4. The resin sheet according to claim 1, wherein the resin sheet has a surface roughness (Rt) of not more than 2 μm.

5. The resin sheet according to claim 1, wherein the glass fiber cloth-like material is included in the resin sheet at a ratio in a range of 20 to 80 wt %.

6. The resin sheet according to claim 1, wherein the resin sheet is a single-layered body into which the glass fiber cloth-like material and the resin layer containing the epoxy resin are integrated.

7. The resin sheet according to claim 1, wherein the resin layer is formed of the epoxy resin that is cured in a state of being impregnated into the glass fiber cloth-like material.

8. The resin sheet according to claim 1, wherein the glass fiber cloth-like material is embedded in the resin layer containing the epoxy resin.

9. The resin sheet according to claim 1, further comprising a hard-coat layer.

10. The resin sheet according to claim 1, further comprising a gas barrier layer.

11. A liquid crystal cell substrate comprising a resin sheet as claimed in claim 1.

12. A liquid crystal cell comprising a liquid crystal cell substrate as claimed in claim 11 and a liquid crystal.

13. A liquid crystal display comprising a liquid crystal cell as claimed in claim 12.

14. An image display comprising a resin sheet as claimed in claim 1.

15. A substrate for electroluminescent display comprising a resin sheet as claimed in claim 1.

16. An electroluminescent display comprising a substrate for electroluminescent display as claimed in claim 15.

17. A substrate for a solar cell comprising a resin sheet as claimed in claim 1.

18. A solar cell comprising a substrate for a solar cell as claimed in claim 17.

* * * * *